(12) United States Patent
Dan et al.

(10) Patent No.: US 10,775,441 B2
(45) Date of Patent: Sep. 15, 2020

(54) INSULATION DETECTION CIRCUIT, DETECTION METHOD, AND BATTERY MANAGEMENT SYSTEM

(71) Applicant: Contemporary Amperex Technology Co., Limited, Ningde, Fujian (CN)

(72) Inventors: Zhimin Dan, Ningde (CN); Zhanyu Sun, Ningde (CN); Yizhen Hou, Ningde (CN); Jiechao Luo, Ningde (CN); Wei Zhang, Ningde (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 89 days.

(21) Appl. No.: 16/112,718

(22) Filed: Aug. 26, 2018

(65) Prior Publication Data
US 2019/0064279 A1   Feb. 28, 2019

(30) Foreign Application Priority Data

Aug. 29, 2017 (CN) .......................... 2017 1 0757915

(51) Int. Cl.
*G01R 31/36* (2020.01)
*G01R 31/389* (2019.01)
(Continued)

(52) U.S. Cl.
CPC .......... *G01R 31/389* (2019.01); *G01R 27/025* (2013.01); *G01R 31/14* (2013.01); *G01R 31/3648* (2013.01); *G01R 31/3278* (2013.01)

(58) Field of Classification Search
None
See application file for complete search history.

(56) References Cited

U.S. PATENT DOCUMENTS 5,818,236 A * 10/1998 Sone ..................... B60L 3/0023
324/509
9,046,584 B2 * 6/2015 Tsuchiya ............ G01R 31/3835
320/116
(Continued)

FOREIGN PATENT DOCUMENTS

CN        103688183 B        4/2016
CN        106461733 A        2/2017
(Continued)

OTHER PUBLICATIONS

The extended European search report dated Feb. 22, 2019 for European application No. 18190242.0, 8 pages.
(Continued)

*Primary Examiner* — Jas A Sanghera
(74) *Attorney, Agent, or Firm* — Law Offices of Liaoteng Wang (57) ABSTRACT

An insulation detection circuit, detection method, and battery management system are disclosed in the present disclosure. The insulation detection circuit includes a positive sampling unit, a negative sampling unit, a positive sampling point, a negative sampling point, a reference voltage terminal, and a processor. A first end of the positive sampling unit is connected with positive electrode of the power battery pack to be measured. A second end of the positive sampling unit is connected with the reference voltage terminal and the positive sampling point. A first end of the negative sampling unit is connected with negative electrode of the power battery pack to be measured. A second end of the negative sampling unit is connected with the reference voltage terminal and the negative sampling point. The processor is connected with the positive sampling point and the negative sampling point.

19 Claims, 5 Drawing Sheets

(51) Int. Cl.
*G01R 31/14* (2006.01)
*G01R 27/02* (2006.01)
*G01R 31/327* (2006.01)

(56) References Cited

U.S. PATENT DOCUMENTS

| | | | |
|---|---|---|---|
| 2004/0189330 A1 | 9/2004 | Herb et al. | |
| 2011/0115490 A1* | 5/2011 | Klijn | G01R 27/025 324/430 |
| 2013/0229742 A1* | 9/2013 | Auguet | B60L 3/0046 361/114 |
| 2014/0084933 A1* | 3/2014 | Jang | G01R 31/025 324/430 |
| 2014/0095093 A1* | 4/2014 | Hong | G01R 31/1227 702/63 |
| 2015/0276846 A1 | 10/2015 | Paris et al. | |
| 2017/0138995 A1 | 5/2017 | Rodrigues et al. | |

FOREIGN PATENT DOCUMENTS

| | | |
|---|---|---|
| CN | 104220887 B | 3/2017 |
| CN | 104220886 B | 5/2017 |
| DE | 10304234 A1 | 8/2004 |
| DE | 102014220017 A1 | 4/2016 |
| DE | 102016100868 A1 | 7/2016 |
| EP | 2413148 A2 | 2/2012 |
| JP | 409274062 A | 10/1997 |
| KR | 101388466 B1 | 4/2014 |

OTHER PUBLICATIONS

The Examination Report dated Jan. 22, 2020 for European application No. 18190242.0, 7 pages.

* cited by examiner

INSULATION DETECTION CIRCUIT, DETECTION METHOD, AND BATTERY MANAGEMENT SYSTEM

CROSS REFERENCE TO RELATED APPLICATION

The present application is based upon and claims the benefits of Chinese Patent Application No. CN 201710757915.0 filed on Aug. 29, 2017, the entire contents of which are incorporated herein by reference.

FIELD

The present disclosure generally relates to batteries, and more particularly to an insulation detection circuit, detection method, and battery management system.

BACKGROUND

Power battery pack is responsible for storing and supplying power. In use, it is necessary to design an insulation detection circuit for the power battery pack to monitor whether the insulation resistance values of the positive electrode and the negative electrode of the power battery pack meets standards, thus avoiding security issues due to failure of the insulation resistance values of the positive electrode and the negative electrode of the power battery pack in meeting the standards.

Currently, in the insulation detection circuit, the power battery pack and a sampling unit are set in non-common-ground-connection. Non-common-ground-connection means that the positive electrode and the negative electrode of the power battery pack are grounded with high voltage, and the sampling unit is grounded with low voltage. An isolation unit is provisioned after the sampling unit, in order to isolate interference from a high voltage grounded signal of the power battery pack to a sampled signal of the sampling unit.

However, inventors of the present application have found that the isolation unit of the prior art also introduces a new interference signal while isolating the high voltage grounded signal of the power battery pack, resulting in a decrease in the accuracy of the sampled signal.

SUMMARY

The present disclosure provides an insulation detection circuit, detection method, and battery management system, which are able to connect a power battery pack and a sampling unit in common ground, so that it is not necessary to introduce an isolation unit, thereby improving the accuracy of the sampled signal.

In a first aspect, an insulation detection circuit for detecting a power battery pack is provided in embodiments of the present disclosure. The insulation detection circuit may include a positive sampling unit, a negative sampling unit, a positive sampling point, a negative sampling point, a reference voltage terminal, and a processor. A first end of the positive sampling unit is connected with positive electrode of the power battery pack to be measured. A second end of the positive sampling unit is connected with the reference voltage terminal and the positive sampling point. The positive sampling unit is configured to provide a positive sampled signal for the positive sampling point. A first end of the negative sampling unit is connected with negative electrode of the power battery pack to be measured. A second end of the negative sampling unit is connected with the reference voltage terminal and the negative sampling point. The negative sampling unit is configured to provide a negative sampled signal for the negative sampling point. The processor is connected with the positive sampling point and the negative sampling point, and the processor is configured to obtain a positive insulation resistance value and a negative insulation resistance value of the power battery pack to be measured based on the positive sampled signal and the negative sampled signal.

In some embodiments of the first aspect, the positive sampling unit includes a first switch, a first resistor network, and a second resistor network which are connected in series. A first end of the first switch is connected with the positive electrode of the power battery pack to be measured. A second end of the first switch is connected with a first end of the first resistor network. A second end of the first resistor network is connected with a first end of the second resistor network and the positive sampling point. A second end of the second resistor network is connected with the reference voltage terminal.

In some embodiments of the first aspect, the negative sampling unit includes a second switch, a third resistor network, and a fourth resistor network which are connected in series. A first end of the second switch is connected with the reference voltage terminal. A second end of the second switch is connected with a first end of the third resistor network. A second end of the third resistor network is connected with a first end of the fourth resistor network and the negative sampling point. A second end of the fourth resistor network is connected with the negative electrode of the power battery pack to be measured.

In some embodiments of the first aspect, the insulation detection circuit further comprises a first fixed resistor network. A first end of the first fixed resistor network is connected with the positive electrode of the power battery pack to be measured, and a second end of the first fixed resistor network is grounded.

In some embodiments of the first aspect, the insulation detection circuit further comprises a second fixed resistor network. A first end of the second fixed resistor network is connected with the negative electrode of the power battery pack to be measured, and a second end of the second fixed resistor network is grounded.

In some embodiments of the first aspect, the insulation detection circuit further comprises a voltage pull-up unit which is connected with the negative sampling point. The voltage pull-up unit is configured to generate a pull-up voltage and pull the negative sampled signal up to a positive voltage signal using the pull-up voltage.

In some embodiments of the first aspect, the voltage pull-up unit comprises a DC voltage source and a fifth resistor network which are connected with each other. The fifth resistor network is connected with the negative sampling point.

In some embodiments of the first aspect, the insulation detection circuit further comprises a first analog-to-digital converter (ADC). The first ADC is connected with the positive sampling point and the processor. The first ADC is configured to convert an analog signal sampled at the positive sampling point into a digital signal.

In some embodiments of the first aspect, the insulation detection circuit further comprises a second ADC which is connected to the negative sampling point and the processor. The second ADC is configured to convert an analog signal sampled at the negative sampling point into a digital signal.

In some embodiments of the first aspect, the processor is further configured to: compare the positive insulation resistance value and a preset threshold of positive insulation resistance value to obtain a comparison result of the positive insulation resistance value; and obtain status of the positive insulation resistance value based on the comparison result of the positive insulation resistance value.

In some embodiments of the first aspect, the processor is further configured to: compare the negative insulation resistance value and a preset threshold of negative insulation resistance value to obtain a comparison result of the negative insulation resistance value; and obtain status of the negative insulation resistance value based on the comparison result of the negative insulation resistance value.

In a second aspect, a battery management system is provided in embodiments of the present disclosure. The battery management system includes the above insulation detection circuit.

In a third aspect, a detection method for an insulation detection circuit used in the above insulation detection circuit is provided in embodiments of the present disclosure. The detection method includes: obtaining a positive sampled signal from the positive sampling point and obtaining a negative sampled signal from the negative sampling point; and obtaining the positive insulation resistance value and the negative insulation resistance value of the power battery pack to be measured based on the positive sampled signal and the negative sampled signal.

In some embodiments of the third aspect, the obtaining a positive sampled signal from the positive sampling point and obtaining a negative sampled signal from the negative sampling point comprises: having both of the first switch and the second switch in ON state to obtain a first positive sampled signal from the positive sampling point and obtain a first negative sampled signal from the negative sampling point, having the first switch in ON state and the second switch in OFF state to obtain a second positive sampled signal from the positive sampling point; and having the first switch in OFF state and the second switch in ON state to obtain a second negative sampled signal from the negative sampling point.

In some embodiments of the third aspect, the obtaining the positive insulation resistance value and the negative insulation resistance value of the power battery pack to be measured based on the positive sampled signal and the negative sampled signal comprises: converting the first positive sampled signal into a first positive sampled voltage; converting the first negative sampled signal into a first negative sampled voltage; converting the second positive sampled signal into a second positive sampled voltage; converting the second negative sampled signal into a second negative sampled voltage; and obtaining the positive insulation resistance value and the negative insulation resistance value of the power battery pack to be measured based on the first positive sampled voltage, the first negative sampled voltage, the second positive sampled voltage, and the second negative sampled voltage.

The insulation detection circuit disclosed in embodiments of the present disclosure includes a positive sampling unit, a negative sampling unit, a positive sampling point, a negative sampling point, a reference voltage terminal, and a processor. An end of the positive sampling unit and an end of the negative sampling unit are connected with the positive electrode and the negative electrode of the power battery pack to be measured respectively. Another end of the positive sampling unit and another end of the negative sampling unit are connected with the reference voltage terminal. That is, the positive sampling unit and the negative sampling unit are in low voltage common-ground-connection with the power battery pack. The positive sampling unit may provide a positive sampled signal for the positive sampling point. The negative sampling unit may provide a negative sampled signal for the negative sampling point. The processor may obtain a positive insulation resistance value and a negative insulation resistance value of the power battery pack based on the positive sampled signal and the negative sampled signal.

BRIEF DESCRIPTION OF THE DRAWINGS

The present disclosure will be better understood from the following detailed description of the disclosure in conjunction with the accompanying drawings in which like or similar reference numerals refer to like or similar features.

DETAILED DESCRIPTION

Features of various aspects and exemplary embodiments of embodiments of the present disclosure will be described in detail below. In the following detailed description, many specific details are disclosed to provide a thorough understanding of embodiments of the present disclosure. However, it is apparent to a person skilled in the art that embodiments of the present disclosure may be practiced without some of these specific details. The following descriptions of embodiments are merely to provide a better understanding of embodiments of the present disclosure through illustrating examples of embodiments of the present disclosure. Embodiments of the present disclosure is by no means limited to any specific configuration and algorithm disclosed below, but rather covering any modification, substitution, and improvement of elements, components, and algorithms without departing from the spirit of embodiments of the present disclosure. In the appended drawings and the following descriptions, well-known structures and techniques are not illustrated to avoid unnecessarily obscuring embodiments of the present disclosure.

The embodiments of the disclosure provides an insulation detection circuit, detection method, and a battery management system. The insulation detection circuit may monitor in real-time whether the insulation resistance values of the positive electrode and the negative electrode of the power battery pack meets standards. It is to be noted that the power battery pack to be measured in the embodiments of the present disclosure may be a lithium ion battery, a lithium metal battery, a lead acid battery, a nickel battery, a nickel hydrogen battery, a lithium sulfur battery, a lithium air battery or a sodium ion battery, and the disclosure is not limited in this respect. In terms of scale, the power battery pack to be measured may also be a cell or a battery module or a battery package, which is not limited herein. The battery management system includes the insulation detection circuit. Illustratively, the insulation detection circuit may be integrated in a battery management system.

Figure 1:
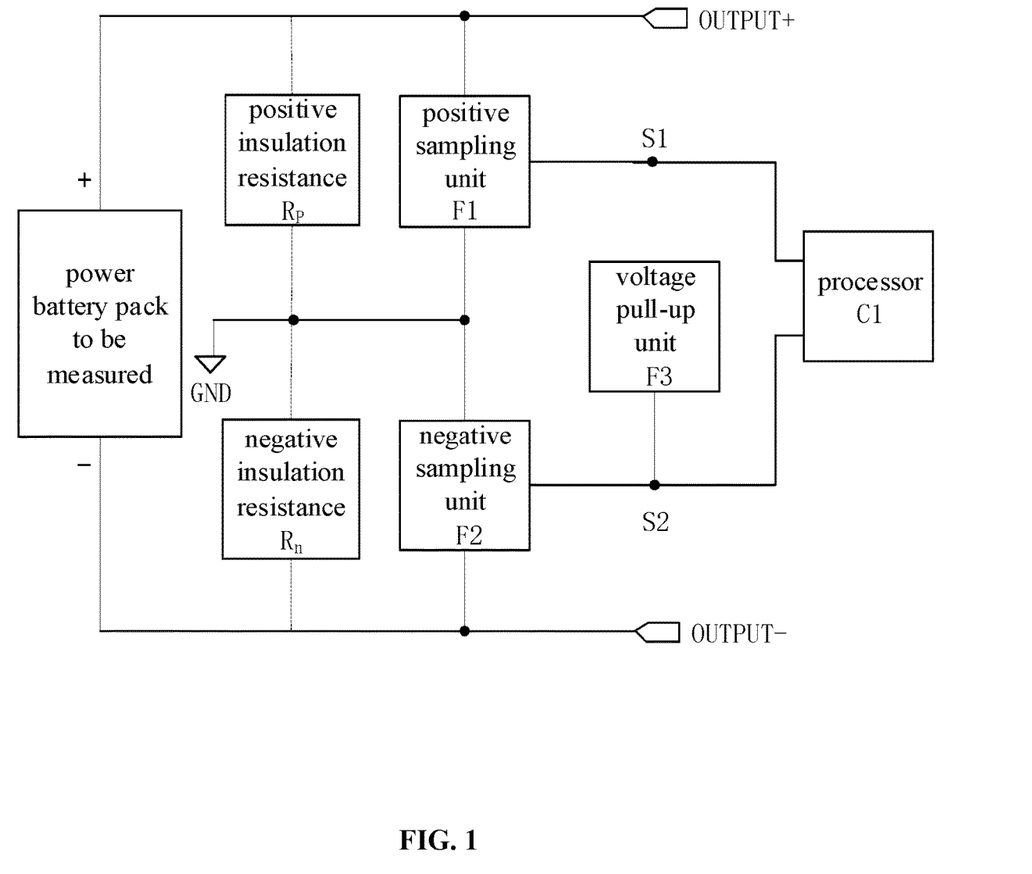
FIG. 1 is a structure diagram of an insulation detection circuit according to an embodiment of the present disclosure.

FIG. 1 is a structure schematic of an insulation detection circuit according to an embodiment of the present disclosure. As shown in FIG. 1, the insulation detection circuit includes a positive sampling unit F1, a negative sampling unit F2, a positive sampling point S1, a negative sampling point S2, a reference voltage terminal GND, and a processor C1.

A first end of the positive sampling unit F1 is connected with the positive electrode of the power battery pack to be measured. A second end of the positive sampling unit F1 is connected with the reference voltage terminal GND and the positive sampling point S1. The positive sampling unit F1 is configured to provide a positive sampled signal for the positive sampling point S1.

A first end of the negative sampling unit F2 is connected with the negative electrode of the power battery pack to be measured. A second end of the negative sampling unit F2 is connected with the reference voltage terminal GND and the negative sampling point S2. The negative sampling unit F2 is configured to provide a negative sampled signal for the negative sampling point S2.

The processor C1 is connected with the positive sampling point S1 and the negative sampling point S2. The processor C1 is configured to acquire positive insulation resistance value and negative insulation resistance value of the power battery pack by calculation according to the positive sampled signal and the negative sampled signal.

It should be noted that the actual voltage of the reference voltage terminal GND may be set according to working conditions and requirements of the insulation detection circuit. However, voltage of the reference voltage terminal GND is used as reference voltage in the insulation detection circuit, that is, the reference voltage of the reference voltage terminal GND may be regarded as relative 0V. For example, if the actual voltage of the reference voltage terminal GND is 6V and actual voltage of the sampled signal sampled by the positive sampling point S1 is 22V, the reference voltage 6V can be recorded as 0V and the voltage of the sampled signal sampled by the positive sampling point S1 is recorded as 16V.

In an embodiment of the present disclosure, an end of the positive sampling unit F1 and an end of the negative sampling unit F2 are connected with the positive and negative electrodes of the power battery pack to be measured respectively. Another end of the positive sampling unit F1 and another end of the negative sampling unit F2 are connected with the reference voltage terminal. That is, a positive electrode circuit is formed from the positive electrode of the power battery to be measured through the positive sampling unit F1 and the reference voltage terminal GND, and a negative electrode circuit is formed from the negative electrode of the power battery pack through the negative sampling unit F2 and the reference voltage terminal GND. In other words, the positive sampling unit F1 and the negative sampling unit F2 are in low voltage common-ground-connection with the power battery pack.

Compared with the power battery pack and the sampling units being grounded with high voltage and low voltage respectively in prior art, the positive sampling unit F1, the negative sampling unit F2 are in low voltage common-ground-connection with the power battery pack, so that it is not necessary for the insulation detection circuit to introduce the isolation unit to isolate interference from the high voltage grounded signal of the power battery pack to the sampled signal of the sampling units. In other words, it is avoided to introduce a new interference signal, and thus the accuracy of the sampled signal can be improved.

In addition, the structure of the insulation detection circuit is simplified, since the isolation unit is not required to isolate the interference from the high voltage grounded signal of the power battery pack to the sampled signal of the sampling units.

Figure 2:
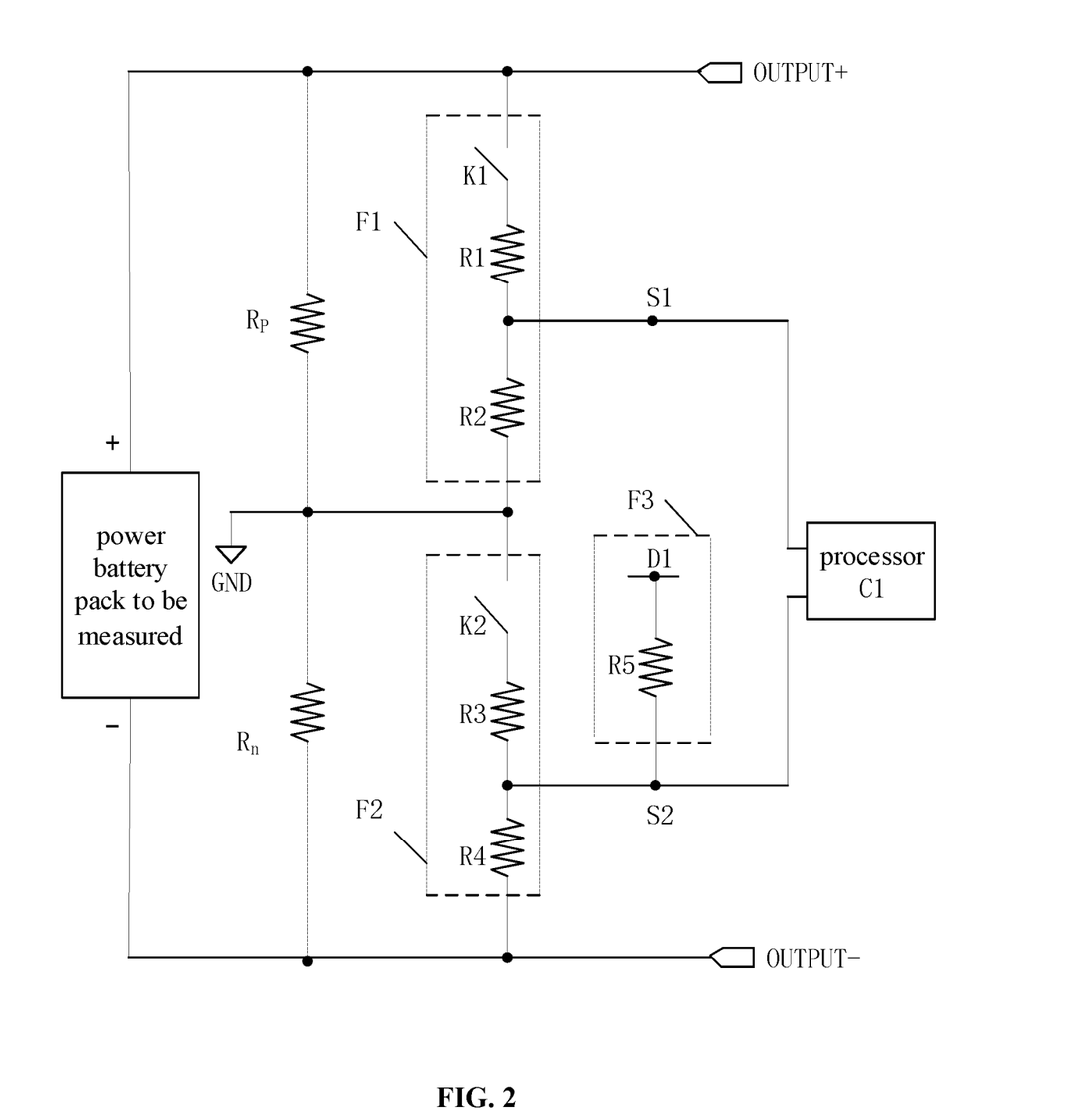
FIG. 2 is a structure diagram of an insulation detection circuit according to another embodiment of the present disclosure.

FIG. 2 is a structure diagram of an insulation detection circuit according to another embodiment of the present disclosure. As shown in FIG. 2, the positive sampling unit F1 and the negative sampling unit F2 may be composed of components. Specific structure of the positive sampling unit F1 and the negative sampling unit F2 will be described below by way of example.

In an example, the positive sampling unit F1 includes a first switch K1, a first resistor network R1 and a second resistor network R2 in series.

A first end of the first switch K1 is connected with the positive electrode of the power battery pack to be measured. A second end of the first switch K1 is connected with a first end of the first resistor network R1. A second end of the first resistor network R1 and a first end of the second resistor network R2 are connected with the positive sampling point S1. A second end of the second resistor network R2 is connected with the reference voltage terminal GND.

The first resistor network R1 and the second resistor network R2 work for voltage dividing. The range of the positive sampled signal of the positive sampling point S1 can be adjusted by adjusting resistance values of the first resistor network R1 and the second resistor network R2. Illustratively, the form of the resistor network and the resistance value of the first resistor network R1 may be the same as that of the second resistor network R2.

The negative sampling unit F2 includes a second switch K2, a third resistor network R3, and a fourth resistor network R4 in series.

A first end of the second switch K2 is connected with the reference voltage terminal GND. A second end of the second switch K2 is connected with a first end of the third resistor network R3. A second end of the third resistor network R3 is connected with a first end of the fourth resistor network R4 and the negative sampling point S2. A second end of the fourth resistor network R4 is connected with the negative electrode of the power battery pack to be measured.

The third resistor network R3 and the fourth resistor network R4 work for voltage dividing. The range of the negative sampled signal of the negative sampling point S2 may be adjusted by adjusting resistance values of the third resistor network R3 and the fourth resistor network R4. Illustratively, the form of the resistor network and the resistance value of the third resistor network R3 may be the same as that of the fourth resistor network R4.

The voltage of the negative sampled signal of the negative sampling point S2 may be smaller than the voltage of the reference voltage terminal GND (i.e., relative 0V) due to voltage drop of current. That is, the negative sampled signal of the negative sampling point S2 may be negative.

As shown in FIG. 1, the insulation detection circuit further includes a voltage pull-up unit F3 to avoid configuring a structure which is able to process the negative voltage signal in the insulation detection circuit. The voltage pull-up unit F3 is connected with the negative sampling point S2. The voltage pull-up unit F3 is configured to generate a pull-up voltage, and pull the negative sampled signal up to a positive voltage signal with the pull-up voltage.

In an example, referring to FIG. 2, the voltage pull-up unit F3 includes a direct current (DC) voltage source D1 and a fifth resistor network R5 connected with each other. The fifth resistor network R5 is also connected with the negative sampling point S2. The DC voltage source D1 may generate a pull-up voltage U0, and the pull-up voltage U0 is greater than the voltage of the reference voltage terminal GND.

It should be noted that the first resistor network R1 to the fifth resistor network R5 each may include one resistor, and may also include two or more resistors in series and/or in parallel. In the insulation detection circuit shown in FIG. 2, the first resistor network R1 to the fifth resistor network R5 each include one resistor.

In an example, the form of resistor network and the resistance value of the first resistor network R1 to the fifth resistive network R5 may be determined based on the sampling range and accuracy of sampling at the positive sampling point S1 and the negative sampling point S2. The disclosure is not limited in this respect.

In another example, the form of resistor network and the resistance value of the first resistor network R1 to the fifth resistive network R5 may be determined based on normal allowable range of the sampling unit sampled at the positive sampling point S1 and the negative sampling point S2. The disclosure is not limited in this respect.

In yet another example, the form of resistor network and the resistance value of the first resistor network R1 to the fifth resistive network R5 may also be determined based on the tolerance range of normal operating voltage of the components in the insulation detection circuit. The disclosure is not limited in this respect.

In an illustrative example, the form of resistor network and the resistance value of the first resistor network R1 and the third resistor network R3 may be the same. The form of resistor network and the resistance value of the second resistor network R2 and the fourth resistor network R4 may be the same.

Both the positive sampling point S1 and the negative sampling point S2 may be used to connect to the sampling units. In an example, a sampling unit may be a component capable of implementing sampling function. For example, the sampling unit may be an ADC (Analog-to-Digital Converter).

In an example, the insulation detection circuit further includes a first ADC (not shown). The first ADC is connected with the positive sampling point S1 and the processor C1. The first ADC is configured to convert an analog signal sampled at the positive sampling point S1 to a digital signal.

In another example, the insulation detection circuit further includes a second ADC (not shown). The second ADC is connected with the negative sampling point S2 and the processor C1. The second ADC is configured to convert an analog signal sampled at the negative sampling point S2 to a digital signal.

It should be noted that the positive sampling point S1 and the negative sampling point S2 may also share an ADC. The ADC convert the analog signals sampled at the positive sampling point S1 and the negative sampling point S2 to digital signals, respectively.

FIG. 2 also shows the first switch K1 and the second switch K2 in the insulation detection circuit.

The first switch K1 controls the positive sampling point S1 to provide a positive sampled signal. When the first switch K1 is in ON state, the positive sampling point S1 can provide a positive sampled signal. When the first switch K1 is in OFF state, the positive sampling point S1 stops supplying the positive sampled signal.

The second switch K2 controls the negative sampling point S2 to provide a negative sampled signal. When the second switch K2 is in ON state, the negative sampling point S2 can provide a negative sampled signal. When the second switch K2 is in OFF state, the negative sampling point S2 stops supplying the negative sampled signal.

It is to be noted that the first switch K1 and the second switch K2 can be set according to specific working scenarios and demands. In an example, any one or more switches of the first switch K1 and the second switch K2 may be provided in the insulation detection circuit. The switch includes a component capable of effecting switching function, and the disclosure is not limited in this respect. For example, the switch may be a mechanical switch such as a single-pole-single-throw switch and the like, and also may be an electronic switch such as a triode, a metal-oxide-semiconductor field effect transistor (MOS) transistor and the like.

Referring to FIGS. 1 and 2, the processor C1 in an embodiment of the present disclosure may be configured to obtain a positive insulation resistance value and a negative insulation resistance value of the power battery pack to be measured based on the positive sampled signal and the negative sampled signal.

Furthermore, the processor C1 may be further configured to obtain comparison result of the positive insulation resistance value by comparing the positive insulation resistance value and a preset positive insulation resistance threshold, and obtain status of the positive insulation resistance value based on the comparison result of the positive insulation resistance value.

According to an embodiment of the present disclosure, it is possible to avoid safety problems due to the insulation resistance values of the positive electrode and the negative electrode of the power battery pack failing to meet the standard by monitoring whether or not the insulation resistance values of the positive electrode and the negative electrode of the power battery pack meets the standard.

Figure 3:
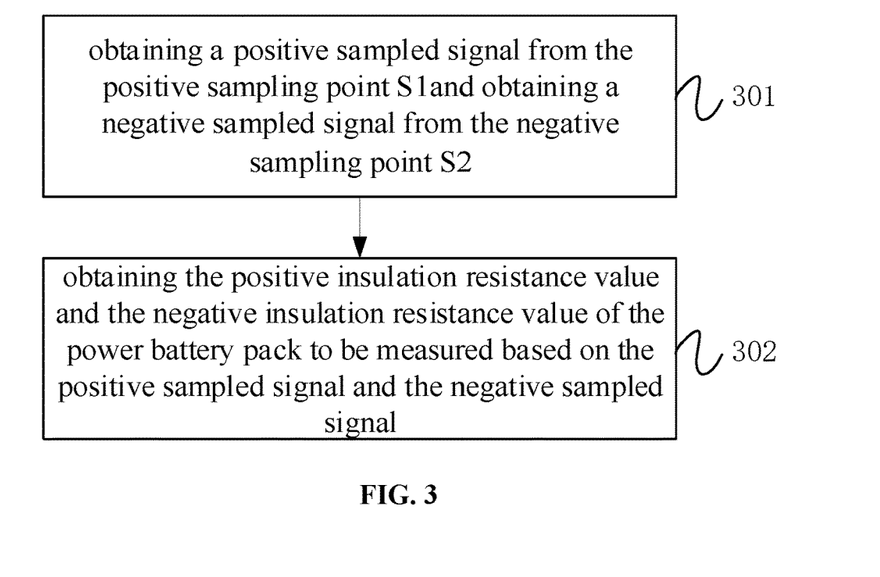
FIG. 3 is a flow chart of a detection method for an insulation detection circuit according to an embodiment of the present disclosure.

FIG. 3 is a flow chart of a detection method for an insulation detection circuit according to an embodiment of the present disclosure. As shown in FIG. 3, the detection method includes steps 301 and 302.

In step 301, a positive sampled signal is obtained from the positive sampling point S1, and a negative sampled signal is obtained from the negative sampling point S2.

The positive sampled signal and the negative sampled signal need to be sampled in conjunction with ON state and OFF state of the first switch K1 and the second switch K2.

Figure 4:
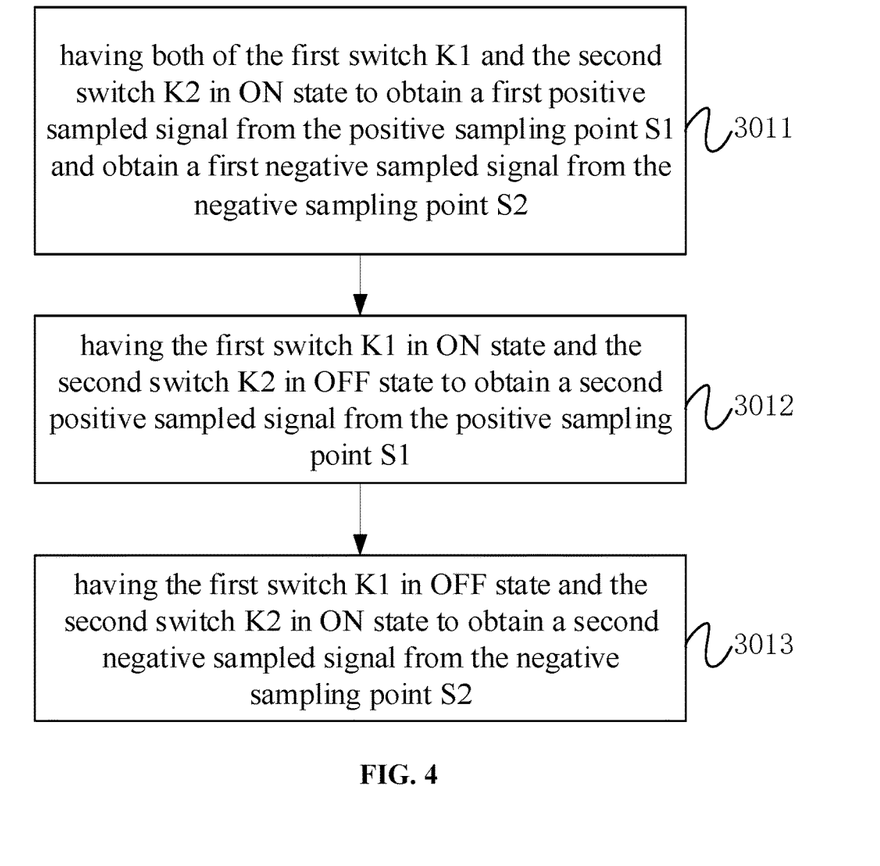
FIG. 4 is a flow chart of a detection method for an insulation detection circuit according to another embodiment of the present disclosure.

FIG. 4 is a flow chart of a detection method for an insulation detection circuit according to another embodiment of the present disclosure. Step 301 in FIG. 3 may be refined as steps 3011 to 3013 in FIG. 4.

In step 3011, both of the first switch K1 and the second switch K2 are in ON state. A first positive sampled signal is obtained from the positive sampling point S1, and a first negative sampled signal is obtained from the negative sampling point S2.

In step 3012, the first switch K1 is in ON state, and the second switch K2 is in OFF state. A second positive sampled signal is obtained from the positive sampling point S1.

In step 3013, the first switch K1 is in OFF state, and the second switch K2 is in ON state. A second negative sampled signal is obtained from the negative sampling point S2.

In step 302, the positive insulation resistance value and the negative insulation resistance value of the power battery pack to be measured are obtained based on the positive sampled signal and the negative sampled signal.

In particular, upon the first positive sampled signal, the first negative sampled signal, the second positive sampled signal, and the second negative sampled signal are collected, firstly the first positive sampled signal may be converted into first positive sampled voltage, the first negative sampled signal may be converted into first negative sampled voltage, the second positive sampled signal may be converted into the second positive sampled voltage, and the second negative sampled signal may be converted into the second negative sampled voltage. And then the positive insulation resistance value and the negative insulation resistance value of the power battery pack to be measured may be obtained based on the first positive sampled voltage, the first negative sampled voltage, the second positive sampled voltage, and the second negative sampled voltage.

FIG. 1 and FIG. 2 also schematically show the position of the positive insulation resistance value and the negative insulation resistance value of the power battery pack to be measured in the circuit diagrams. In the figures, $R_p$ indicates the positive insulation resistance value of the power battery pack, and $R_n$ indicates the negative insulation resistance value of the power battery pack.

As shown by the dotted line in FIG. 2, a first end of $R_p$ is connected with the positive electrode of the power battery pack to be measured, and a second end of $R_p$ is connected with the reference voltage terminal GND. The calculation of the positive insulation resistance value and the negative insulation resistance value of the power battery pack to be measured will be described in connection with FIG. 2 below.

In FIG. 2, the processor C1 may make both of the first switch K1 and the second switch K2 in ON state simultaneously as a first switch state. Positive terminal voltage $U_{p0}$ and negative terminal voltage $U_{n0}$ of the power battery pack to be measured under the first switch state may be calculated based on the first positive sampled signal sampled from the first positive sampling point S1 and the first negative sampled signal sampled from the first negative sampling point S2 under the first switch state.

The processor C1 may make the first switch K1 in ON state and the second switch K2 in OFF state as a second switch state. Positive terminal voltage $U_{p1}$ of the power battery pack to be measured under the second switch state may be calculated based on the first positive sampled signal sampled under the second switch state.

The processor C1 may make the first switch K1 in OFF state and the second switch K2 in ON state as a third switch state. Negative terminal voltage $U_{n2}$ of the power battery pack to be measured under the third switch state may be calculated based on the first negative sampled signal sampled under the third switch state.

The processor C1 may calculate the positive insulation resistance value and the negative insulation resistance value of the power battery pack to be measured based on the positive terminal voltage $U_{p0}$ of the power battery pack to be measured under the first switch state, the negative terminal voltage $U_{n0}$ of the power battery pack to be measured under the first switch state, the positive terminal voltage $U_{p1}$ of the power battery pack to be measured under the second switch state, and the negative terminal voltage $U_{n2}$ of the power battery pack to be measured under the third switch state.

First, when both of K1 and K2 are in ON state, the processor C1 may obtain the following Equation (1) based on the sampled voltage $U_{mp0}$ of the first positive sampled signal and the sampled voltage $U_{mn0}$ of the first negative sampled signal sampled under the first switch state.

$$\begin{cases} U_{p0} = \dfrac{U_{mp0}(R_1 + R_2)}{R_2} \\ U_{n0} = \dfrac{U_{mn0}(R_3 + R_4)}{R_3} \\ \dfrac{U_{p0}}{U_{n0}} = \dfrac{\dfrac{R_p(R_1 + R_2)}{R_1 + R_2 + R_p}}{\dfrac{R_n(R_3 + R_4)}{R_3 + R_4 + R_n}} \\ U_B = U_{p0} + U_{n0} \end{cases} \quad (1)$$

In Equation (1), $U_{p0}$ indicates the positive terminal voltage of the power battery pack to be measured under the first switch state, $U_{n0}$ indicates the negative terminal voltage of the power battery pack to be measured under the first switch state, $R_1$ indicates the resistance value of the first resistor network, $R_2$ indicates the resistance value of the second resistor network, $R_3$ indicates the resistance value of the third resistor network, $R_4$ indicates the resistance value of the fourth resistor network, $R_p$ indicates the positive insulation resistance value of the power battery pack to be measured, and $R_n$ indicates the negative insulation resistance value of the power battery pack to be measured.

Then, when K1 is in ON state and K2 is in OFF state, the processor C1 may obtain the following Equation (2) based on the sampled voltage $U_{mp1}$ of the first positive sampled signal sampled under the second switch state.

$$\begin{cases} U_{p1} = \dfrac{U_{mp1}(R_1 + R_2)}{R_2} \\ U_{n1} = U_B - U_{p1} \\ \dfrac{U_{p1}}{U_{n1}} = \dfrac{\dfrac{R_p(R_1 + R_2)}{R_1 + R_2 + R_p}}{R_n} \\ U_B = U_{n1} + U_{p1} \end{cases} \quad (2)$$

In Equation (2), $U_{p1}$ indicates the positive terminal voltage of the power battery pack to be measured under the second switch state, $U_{n1}$ indicates the negative terminal voltage of the power battery pack to be measured under the second switch state, $R_1$ indicates the resistance value of the first resistor network, $R_2$ indicates the resistance value of the second resistor network, $R_p$ indicates the positive insulation resistance value of the power battery pack to be measured, and $R_2$ indicates the negative insulation resistance value of the power battery pack to be measured.

Next, when K1 is in OFF state and K2 is in ON state, the processor C1 may obtain the following Equation (3) based on the sampled voltage $U_{mn2}$ of the first negative sampled signal sampled under the third switch state.

$$\begin{cases} U_{n2} = \dfrac{U_{mn2}(R_3 + R_4)}{R_3} \\ U_{p2} = U_B - U_{n2} \\ \dfrac{U_{n2}}{U_{p2}} = \dfrac{\dfrac{R_n(R_3 + R_4)}{R_3 + R_4 + R_n}}{R_p} \\ U_B = U_{n2} + U_{p2} \end{cases} \quad (3)$$

In Equation (3), $U_{p2}$ indicates the positive terminal voltage of the power battery pack to be measured under the third switch state, $U_{n2}$ indicates the negative terminal voltage of the power battery pack to be measured under the third switch state, $R_3$ indicates the resistance value of the third resistor network, $R_4$ indicates the resistance value of the fourth resistor network, $R_p$ indicates the positive insulation resistance value of the power battery pack to be measured, and $R_n$ indicates the negative insulation resistance value of the power battery pack to be measured.

The positive insulation resistance value and the negative insulation resistance value of the power battery pack to be measured may be obtained by combining the Equation (1), (2), and (3).

In some embodiments, the combined Equation (1), (2) and (3) are solved when R1=R4=Ra and R2=R3=Rb where $R_a$ and $R_b$ are preset resistance values. Then the positive insulation resistance value $R_p$ and the negative insulation resistance value $R_n$ of the power battery pack to be measured are as follows respectively.

$$\begin{cases} R_p = -R_a - R_b - \dfrac{R_a U_{mp1} + R_b U_{mp1} - R_b U_b}{U_{mn2}} \\ R_n = -R_a - R_b - \dfrac{R_a U_{mn2} + R_b U_{mn2} - R_b U_b}{U_{mp1}} \end{cases}$$

By comparing the calculated positive insulation resistance value $R_p$ and the negative insulation resistance value $R_n$ with respective preset standard thresholds, it is possible to monitor whether the insulation resistance values of the positive electrode and the negative electrode of the power battery pack meet the standard in real time, so that the safety problems due to the insulation resistance values of the positive electrode and the negative electrode of the power battery pack failing to meet the standard may be avoided.

Furthermore, it is found by experiments that the sampling accuracy of the insulation detection circuit is low when the phase difference between $R_p$ and $R_n$ is large, and the sampling accuracy of the insulation detection circuit is high when the phase difference between $R_p$ and $R_n$ is small.

Figure 5:
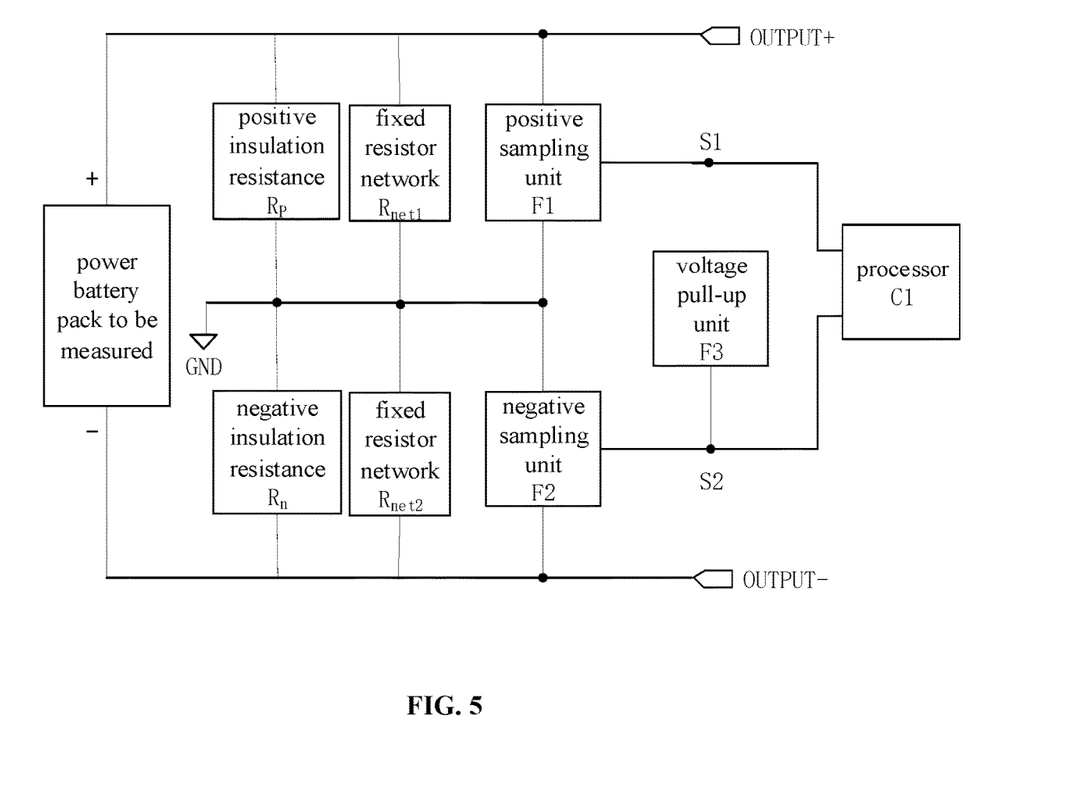
FIG. 5 is a structure diagram of an insulation detection circuit according to yet another embodiment of the present disclosure.

FIG. 5 is a structure diagram of an insulation detection circuit according to yet another embodiment of the present disclosure. In order to improve the sampling accuracy, the insulation detection circuit in FIG. 5 may also include a first fixed resistor network $R_{net1}$. A first end of the first fixed resistor network $R_{net1}$ is connected with the positive electrode of the power battery pack to be measured, and a second end of the first fixed resistor network $R_{net1}$ is grounded. And/or the insulation detection circuit may further include a second fixed resistor network $R_{net2}$. A first end of the second fixed resistor network $R_{net2}$ is connected with the negative electrode of the power battery pack to be measured, and a second end of the second fixed resistor network $R_{net2}$ is grounded. The first or the second fixed resistor network refers to a resistor network which is always present in the insulation detection circuit.

The calculation of the positive insulation resistance value $R_p$ and the negative insulation resistance value $R_n$ of the power battery pack to be measured will be described below by way of examples in the case that the insulation detection circuit includes both of the first fixed resistor network $R_{net1}$ and the second fixed resistor network $R_{net2}$.

First, when both of K1 and K2 are in ON state, the processor C1 may obtain the following Equation (4) based on the sampled voltage $U_{mp0}$ of the first positive sampled signal and the sampled voltage $U_{mn0}$ of the first negative sampled signal sampled under the first switch state.

$$\begin{cases} U_{p0} = \dfrac{U_{mp0}(R_1 + R_2)}{R_2} \\ U_{n0} = \dfrac{U_{mn0}(R_3 + R_4)}{R_3} \\ \dfrac{U_{p0}}{U_{n0}} = \dfrac{\dfrac{(R_p // R_{net1})(R_1 + R_2)}{R_1 + R_2 + (R_p // R_{net1})}}{\dfrac{(R_n // R_{net2})(R_3 + R_4)}{R_3 + R_4 + (R_n // R_{net2})}} \\ U_B = U_{p0} + U_{n0} \end{cases} \quad (4)$$

In Equation (4), $U_{p0}$ indicates the positive terminal voltage of the power battery pack to be measured under the first switch state, $U_{n0}$ indicates the negative terminal voltage of the power battery pack to be measured under the first switch state, $R_1$ indicates the resistance value of the first resistor network, $R_2$ indicates the resistance value of the second resistor network, $R_3$ indicates the resistance value of the third resistor network, $R_4$ indicates the resistance value of the fourth resistor network, $R_p$ indicates the positive insulation resistance value of the power battery pack to be measured, $R_n$ indicates the negative insulation resistance value of the power battery pack to be measured, $R_{net1}$ indicates resistance value of the first fixed resistor network, $R_{net2}$ indicates resistance value of the second fixed resistor network, $R_p//R_{net1}$ indicates parallel resistance value of the positive insulation resistance value and the first fixed resistor network, and $R_n//R_{net2}$ indicates parallel resistance value of the negative insulation resistance value and the second fixed resistor network.

Then, when K1 is in ON state and K2 is in OFF state, the processor C1 may obtain the following Equation (5) based on the sampled voltage $U_{mp1}$ of the first positive sampled signal sampled under the second switch state.

$$\begin{cases} U_{p1} = \dfrac{U_{mp1}(R_1 + R_2)}{R_2} \\ U_{n1} = U_B - U_{p1} \\ \dfrac{U_{p1}}{U_{n1}} = \dfrac{\dfrac{(R_p // R_{net1})(R_1 + R_2)}{R_1 + R_2 + (R_p // R_{net1})}}{(R_n // R_{net2})} \\ U_B = U_{n1} + U_{p1} \end{cases} \quad (5)$$

In Equation (5), $U_{p1}$ indicates the positive terminal voltage of the power battery pack to be measured under the second switch state, $U_{n1}$ indicates the negative terminal voltage of the power battery pack to be measured under the second switch state, $R_1$ indicates the resistance value of the first resistor network, $R_2$ indicates the resistance value of the second resistor network, $R_2$ indicates the positive insulation resistance value of the power battery pack to be measured, $R_n$ indicates the negative insulation resistance value of the power battery pack to be measured, $R_{net1}$ indicates resistance value of the first fixed resistor network, $R_{net2}$ indicates resistance value of the second fixed resistor network, $R_p//R_{net1}$ indicates parallel resistance value of the positive insulation resistance value and the first fixed resistor network, and $R_n//R_{net2}$ indicates parallel resistance value of the negative insulation resistance value and the second fixed resistor network.

Next, when K1 is in OFF state and K2 is in ON state, the processor C1 may obtain the following Equation (6) based on the sampled voltage $U_{mn2}$ of the first negative sampled signal sampled under the third switch state.

$$\begin{cases} U_{n1} = \dfrac{U_{mn2}(R_3 + R_4)}{R_3} \\ U_{p2} = U_B - U_{n2} \\ \dfrac{U_{n2}}{U_{p2}} = \dfrac{\dfrac{(R_n//R_{net2})(R_3 + R_4)}{R_3 + R_4 + (R_n//R_{net2})}}{(R_p//R_{net1})} \\ U_B = U_{n2} + U_{p2} \end{cases} \quad (6)$$

In Equation (6), $U_{p2}$ indicates the positive terminal voltage of the power battery pack to be measured under the third switch state, $U_{n2}$ indicates the negative terminal voltage of the power battery pack to be measured under the third switch state, $R_3$ indicates the resistance value of the third resistor network, $R_4$ indicates the resistance value of the fourth resistor network, $R_p$ indicates the positive insulation resistance value of the power battery pack to be measured, $R_n$ indicates the negative insulation resistance value of the power battery pack to be measured, $R_{net1}$ indicates resistance value of the first fixed resistor network, $R_{net2}$ indicates resistance value of the second fixed resistor network, $R_p//R_{net1}$ indicates parallel resistance value of the positive insulation resistance value and the first fixed resistor network, and $R_n//R_{net2}$ indicates parallel resistance value of the negative insulation resistance value and the second fixed resistor network.

In some embodiments, the combined Equation (1), (2) and (3) are solved when R1=R4=Ra and R2=R3=Rb where $R_a$ and $R_b$ are preset resistance values. Then the positive insulation resistance value $R_p$ and the negative insulation resistance value $R_n$ of the power battery pack to be measured are as follows respectively.

$$\begin{cases} R_p//R_{net1} = -R_a - R_b - \dfrac{R_a U_{mp1} + R_b U_{mp1} - R_b U_b}{U_{mn2}} \\ R_n//R_{net2} = -R_a - R_b - \dfrac{R_a U_{mn2} + R_b U_{mn2} - R_b U_b}{U_{mp1}} \end{cases}$$

In the embodiment, the sampling accuracy of the insulation detection circuit may be improved by the fixed resistor network $R_{net1}$ and the fixed resistor network $R_{net2}$ as described above. Also, the cost-performance ratio of the insulation detection circuit can be improved by reducing the cost due to the low price of resistors.

Figure 6:
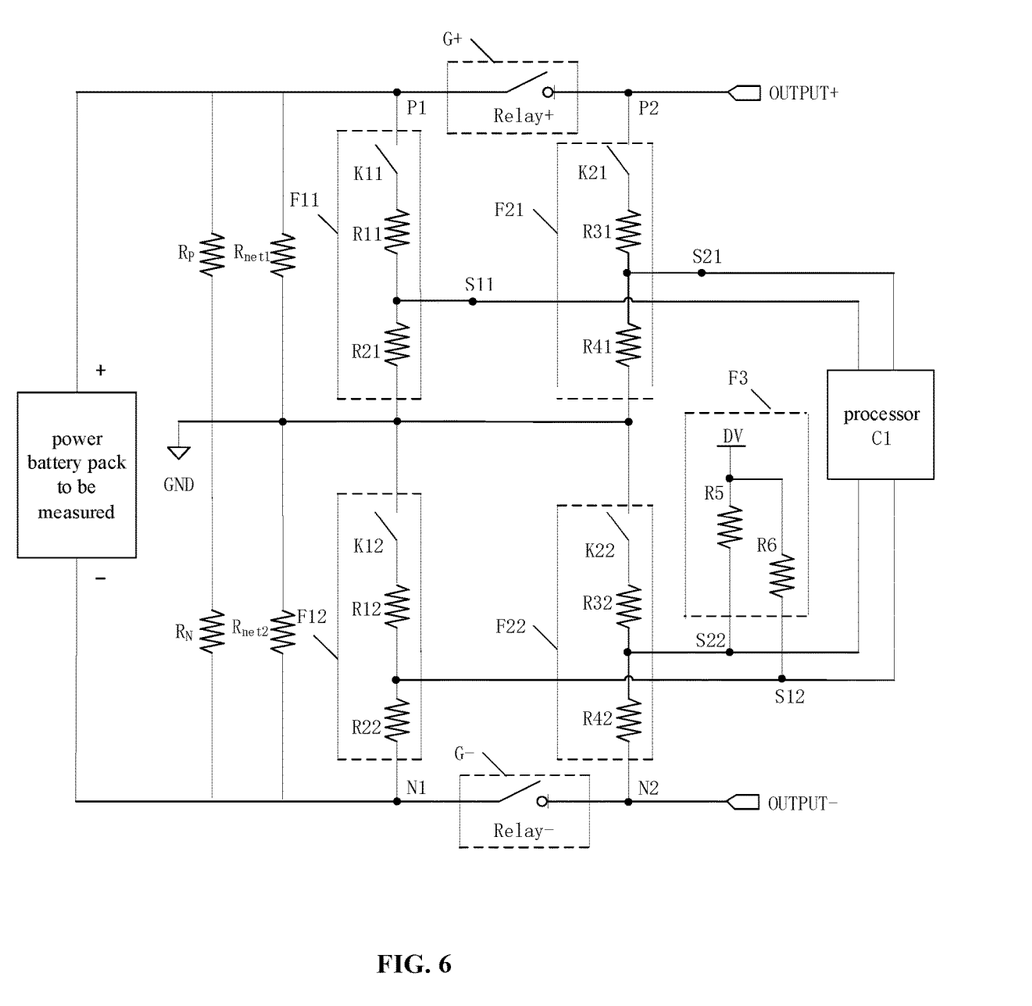
FIG. 6 is a structure diagram of an insulation detection circuit according to yet another embodiment of the present disclosure.

FIG. 6 is a structure diagram of an insulation detection circuit according to yet another embodiment of the present disclosure. The insulation detection circuit in FIG. 6 may include a first positive sampling unit F11, a second positive sampling unit F21, a first negative sampling unit F12, a second negative sampling unit F22, a first positive sampling point S11, a second positive sampling point S21, a first negative sampling point S12, the second negative sampling point S22, the reference voltage terminal GND, and the processor C1. FIG. 6 also schematically shows the positive insulation resistance value $R_p$ and the negative insulation resistance value $R_n$ of the power battery pack.

The first positive sampling unit F11 includes a switch K11, a resistor network R11, and a resistor network R21 which are connected in series.

A first end of the switch K11 is connected with the positive electrode of the power battery pack to be measured and a first end P1 of the positive relay G+. A second end of the switch K11 is connected with a first end of the resistor network R11. A second end of the resistor network R11 is connected with a first end of the resistor network R21 and the first positive sampling point S11. A second end of the resistor network R21 is connected with the reference voltage terminal GND.

The second positive sampling unit F21 includes a switch K21, a resistor network R31, and a resistor network R41 which are connected in series.

A first end of the switch K21 is connected with a second end P2 of the positive relay G+. A second end of the switch K21 is connected with a first end of the resistor network R31. A second end of the resistor network R31 is connected with a first end of the resistor network R41 and the second positive sampling point S21. A second end of the resistor network R41 is connected with the reference voltage terminal GND.

The first negative sampling unit F12 includes a switch K12, a resistor network R12, and a resistor network R22 which are connected in series.

A first end of the switch K12 is connected with the reference voltage terminal GND. A second end of the switch K12 is connected with the resistor network R12. A second end of the resistor network R12 is connected with a first end of the resistor network R22 and the first negative sampling point S12. A second end of the resistor network R22 is connected with the negative electrode of the power battery pack and a first end N1 of the negative relay G−.

The second negative sampling unit F22 includes a switch K22, a resistor network R32, and a resistor network R42 which are connected in series.

A first end of the switch K22 is connected with the reference voltage terminal GND. A second end of the switch K22 is connected with the resistor network R32. A second end of the resistor network R32 is connected with a first end of the resistor network R42 and the second negative sampling point S22. A second end of the resistor network R42 is connected with a second end N2 of the negative relay G−.

FIG. 6 also shows a first fixed resistor network $R_{net1}$ and a second fixed resistor network $IR_{net2}$. A first end of the first fixed resistor network $R_{net1}$ is connected with the positive electrode of the power battery pack to be measured and the first end P1 of the positive relay G+. A second end of the first fixed resistor network $R_{net1}$ is grounded. A first end of the second fixed resistor network $M_{net}$ is connected with the negative electrode of the power battery pack to be measured and the first end N1 of the negative relay G−. A second end of the second fixed resistor network $R_{net2}$ is grounded.

In FIG. 6, one end of each of the first positive sampling unit F11, the second positive sampling unit F21, the first negative sampling unit F12, and the second negative sampling unit F22 is connected with the reference voltage terminal GND. That is, one end of each of the first positive sampling unit F11, the second positive sampling unit F21, the first negative sampling unit F12, and the second negative sampling unit F22 is common-grounded with low voltage. Such an arrangement may not only avoid reducing the accuracy of the sampled signal due to the introduction of the isolation unit, but also simplify the structure of the insulation detection circuit.

According to an embodiment of the present disclosure, the insulation resistance value of the power battery pack to be measured may be measured using the first positive sampling unit F11 and the first negative sampling unit F12 (see FIGS. 1 to 5). The insulation resistance value of the power battery pack to be measured may also be measured using the second positive sampling unit F21 and the second negative sampling unit F22.

According to an embodiment of the present disclosure, a portion or the whole of the insulation detection circuit shown in FIG. 6 may also be used in diagnosis of relays of the power battery pack to be measured and used in high voltage sampling of the power battery pack to be measured so that the circuit shown in FIG. 6 may integrate insulation detection function, relay diagnosis function, and high voltage sampling function for the power battery pack to be measured. The circuit configuration in the embodiments of the present disclosure has the advantages of high accuracy and low cost as compared with the prior art in which a separate circuits are need to be designed for respective functions.

It should be noted that the processor C1 of the embodiments of the present disclosure may be a processing device dedicated to an insulation detection circuit or a processing device common to other circuits. The detection circuit may be a separate circuit structure or a part of the overall circuit structure.

Illustratively, the insulation detection circuit in an embodiment of the present disclosure may be integrated in a battery management system of a power battery pack. A part of the overall circuit structure of the battery management system may be used for insulation detection of the power battery pack, and a central processing unit of the battery management system may calculate the positive insulation resistance value $R_p$ and the negative insulation resistance value $R_n$ of the power battery pack to be measured.

It is to be understood that various embodiments in the description are described in a progressive manner. The same or similar parts among various embodiments may be referred to each other. Different emphasis is placed on different embodiments. For device embodiments, reference may be made to the description of method embodiments for related parts. The embodiments of the present disclosure are not limited to specific steps and structures described above and shown in the drawings. A person skilled in the art may make various changes, modifications, and additions, or change the order of the steps after understanding the spirit of the present disclosure. Also, for the purpose of concision, detailed description of known technique is omitted herein.

It is to be understood, however, that the embodiments of the disclosure are not limited to the specific configurations and processes described above and shown in the drawings. Also, for the purpose of concision, detailed description of known technique is omitted herein. In the above embodiments, a number of specific steps are described and illustrated as examples. However, the processes of the embodiments of the present disclosure are not limited to the specific steps described and illustrated. A person skilled in the art may make various changes, modifications, and additions, or change the order of the steps after understanding the spirit of the present disclosure.

Function blocks illustrated in the above described structure diagram may be implemented as hardware, software, firmware, or combination thereof. When implemented in hardware, it may be, for example, an electronic circuit, Application Specific Integrated Circuit (ASIC), appropriate firmware, plug-in, function card, and the like. When implemented in software, elements of the present disclosure may be programs or code segments used to perform tasks as required. The programs or code segments may be stored in machine readable medium, or communicated over transmission medium or communication links through data signals carried in carriers. The "machine readable medium" may include any medium that can store or communication information. Examples of machine readable medium may include: an electronic circuit, a semiconductor memory device, a ROM, a flash drive, an Erasable ROM (EROM), a floppy, a CD-ROM, an optical disk, a hard disk, optic fiber medium, a radio frequency (RF) link, etc. Code segments may be downloaded via computer networks such as the Internet, an intranet, etc.

What is claimed is:

1. An insulation detection circuit for detecting a power battery pack, comprising:
  a positive sampling unit, a negative sampling unit, a positive sampling point, a negative sampling point, a reference voltage terminal, and a processor,
  wherein a first end of the positive sampling unit is connected with positive electrode of the power battery pack to be measured, a second end of the positive sampling unit is connected with the reference voltage terminal and the positive sampling point, and the positive sampling unit is configured to provide a positive sampled signal for the positive sampling point;
  wherein a first end of the negative sampling unit is connected with negative electrode of the power battery pack to be measured, a second end of the negative sampling unit is connected with the reference voltage terminal and the negative sampling point, and the negative sampling unit is configured to provide a negative sampled signal for the negative sampling point;
  wherein the processor is connected with the positive sampling point and the negative sampling point, and the processor is configured to obtain a positive insulation resistance value and a negative insulation resistance value of the power battery pack to be measured based on the positive sampled signal and the negative sampled signal;
  wherein the positive sampling unit comprises a first switch, and the negative sampling unit comprises a second switch, wherein the positive sampled signal and the negative sampled signal include a first positive sampled signal, a first negative sampled signal, a second positive sampled signal and a second negative sampled signal, and wherein:
    the first positive sampled signal is obtained from the positive sampling point and the first negative sampled signal is obtained from the negative sampling point when both of the first switch and the second switch are in ON state;
    the second positive sampled signal is obtained from the positive sampling point when the first switch is in ON state and the second switch is in OFF state; and
    the second negative sampled signal is obtained from the negative sampling point when the first switch is in OFF state and the second switch is in ON state.

2. The insulation detection circuit of claim 1, wherein the positive sampling unit further comprises a first resistor network and a second resistor network, wherein the first switch, the first resistor network and the second resistor network are connected in series,
- wherein a first end of the first switch is connected with the positive electrode of the power battery pack to be measured, a second end of the first switch is connected with a first end of the first resistor network;
- wherein a second end of the first resistor network is connected with a first end of the second resistor network and the positive sampling point; and
- wherein a second end of the second resistor network is connected with the reference voltage terminal.

3. The insulation detection circuit of claim 1, wherein the negative sampling unit further comprises a third resistor network and a fourth resistor network, wherein the second switch, the third resistor network and the fourth resistor network are connected in series,
- wherein a first end of the second switch is connected with the reference voltage terminal, and a second end of the second switch is connected with a first end of the third resistor network;
- wherein a second end of the third resistor network is connected with a first end of the fourth resistor network and the negative sampling point; and
- wherein a second end of the fourth resistor network is connected with the negative electrode of the power battery pack to be measured.

4. The insulation detection circuit of claim 1, wherein the insulation detection circuit further comprises a voltage pull-up unit which is connected with the negative sampling point, and wherein the voltage pull-up unit is configured to generate a pull-up voltage and pull the negative sampled signal up to a positive voltage signal using the pull-up voltage.

5. The insulation detection circuit of claim 4, wherein the voltage pull-up unit comprises a DC voltage source and a fifth resistor network which are connected with each other, and wherein the fifth resistor network is connected with the negative sampling point.

6. The insulation detection circuit of claim 1, wherein the insulation detection circuit further comprises a first fixed resistor network, and wherein a first end of the first fixed resistor network is connected with the positive electrode of the power battery pack to be measured, and a second end of the first fixed resistor network is grounded.

7. The insulation detection circuit of claim 1, wherein the insulation detection circuit further comprises a second fixed resistor network, and wherein a first end of the second fixed resistor network is connected with the negative electrode of the power battery pack to be measured, and a second end of the second fixed resistor network is grounded.

8. The insulation detection circuit of claim 1, wherein the insulation detection circuit further comprises a first analog-to-digital converter (ADC), and wherein the first ADC is connected with the positive sampling point and the processor, and the first ADC is configured to convert an analog signal sampled at the positive sampling point into a digital signal.

9. The insulation detection circuit of claim 1, wherein the insulation detection circuit further comprises a second ADC which is connected to the negative sampling point and the processor, and wherein the second ADC is configured to convert an analog signal sampled at the negative sampling point into a digital signal.

10. The insulation detection circuit of claim 1, wherein the processor is further configured to:
- compare the positive insulation resistance value and a preset threshold of positive insulation resistance value to obtain a comparison result of the positive insulation resistance value; and
- obtain status of the positive insulation resistance value based on the comparison result of the positive insulation resistance value.

11. The insulation detection circuit of claim 1, wherein the processor is further configured to:
- compare the negative insulation resistance value and a preset threshold of negative insulation resistance value to obtain a comparison result of the negative insulation resistance value; and
- obtain status of the negative insulation resistance value based on the comparison result of the negative insulation resistance value.

12. A battery management system comprising an insulation detection circuit, wherein the insulation detection circuit comprises
- a positive sampling unit, a negative sampling unit, a positive sampling point, a negative sampling point, a reference voltage terminal, and a processor,
- wherein a first end of the positive sampling unit is connected with positive electrode of a power battery pack to be measured, a second end of the positive sampling unit is connected with the reference voltage terminal and the positive sampling point, and the positive sampling unit is configured to provide a positive sampled signal for the positive sampling point;
- wherein a first end of the negative sampling unit is connected with negative electrode of the power battery pack to be measured, a second end of the negative sampling unit is connected with the reference voltage terminal and the negative sampling point, and the negative sampling unit is configured to provide a negative sampled signal for the negative sampling point;
- wherein the processor is connected with the positive sampling point and the negative sampling point, and the processor is configured to obtain a positive insulation resistance value and a negative insulation resistance value of the power battery pack to be measured based on the positive sampled signal and the negative sampled signal;
- wherein the positive sampling unit comprises a first switch, and the negative sampling unit comprises a second switch, wherein the positive sampled signal and the negative sampled signal include a first positive sampled signal, a first negative sampled signal, a second positive sampled signal and a second negative sampled signal, and wherein:
  - the first positive sampled signal is obtained from the positive sampling point and the first negative sampled signal is obtained from the negative sampling point when both of the first switch and the second switch are in ON state;
  - the second positive sampled signal is obtained from the positive sampling point when the first switch is in ON state and the second switch is in OFF state; and
  - the second negative sampled signal is obtained from the negative sampling point when the first switch is in OFF state and the second switch is in ON state.

13. The battery management system of claim 12, wherein the positive sampling unit further comprises a first resistor network and a second resistor network, wherein the first switch, the first resistor network and the second resistor network are connected in series, wherein a first end of the first switch is connected with the positive electrode of the power battery pack to be measured, a second end of the first switch is connected with a first end of the first resistor network;

wherein a second end of the first resistor network is connected with a first end of the second resistor network and the positive sampling point; and wherein a second end of the second resistor network is connected with the reference voltage terminal.

14. The battery management system of claim 12, wherein the negative sampling unit further comprises a third resistor network and a fourth resistor network, wherein the second switch, the third resistor network and the fourth resistor network are connected in series, wherein a first end of the second switch is connected with the reference voltage terminal, and a second end of the second switch is connected with a first end of the third resistor network;

wherein a second end of the third resistor network is connected with a first end of the fourth resistor network and the negative sampling point; and wherein a second end of the fourth resistor network is connected with the negative electrode of the power battery pack to be measured.

15. The battery management system of claim 12, wherein the insulation detection circuit further comprises a voltage pull-up unit which is connected with the negative sampling point, and wherein the voltage pull-up unit is configured to generate a pull-up voltage and pull the negative sampled signal up to a positive voltage signal using the pull-up voltage.

16. The battery management system of claim 15, wherein the voltage pull-up unit comprises a DC voltage source and a fifth resistor network which are connected with each other, and wherein the fifth resistor network is connected with the negative sampling point.

17. The battery management system of claim 12, wherein the insulation detection circuit further comprises a first fixed resistor network, and wherein a first end of the first fixed resistor network is connected with the positive electrode of the power battery pack to be measured, and a second end of the first fixed resistor network is grounded.

18. A detection method for an insulation detection circuit used in the insulation detection circuit of claim 1, the detection method comprising:

obtaining the positive sampled signal from the positive sampling point and obtaining the negative sampled signal from the negative sampling point; and obtaining the positive insulation resistance value and the negative insulation resistance value of the power battery pack to be measured based on the positive sampled signal and the negative sampled signal;

wherein the positive sampling unit comprises a first switch, and the negative sampling unit comprises a second switch, and wherein obtaining the positive sampled signal from the positive sampling point and obtaining the negative sampled signal from the negative sampling point comprises:

having both of the first switch and the second switch in ON state to obtain a first positive sampled signal from the positive sampling point and obtain a first negative sampled signal from the negative sampling point;

having the first switch in ON state and the second switch in OFF state to obtain a second positive sampled signal from the positive sampling point; and having the first switch in OFF state and the second switch in ON state to obtain a second negative sampled signal from the negative sampling point, and wherein the positive sampled signal and the negative sampled signal include the first positive sampled signal, the first negative sampled signal, the second positive sampled signal and the second negative sampled signal.

19. The detection method of claim 18, wherein obtaining the positive insulation resistance value and the negative insulation resistance value of the power battery pack to be measured based on the positive sampled signal and the negative sampled signal comprises:

converting the first positive sampled signal into a first positive sampled voltage;

converting the first negative sampled signal into a first negative sampled voltage;

converting the second positive sampled signal into a second positive sampled voltage;

converting the second negative sampled signal into a second negative sampled voltage; and obtaining the positive insulation resistance value and the negative insulation resistance value of the power battery pack to be measured based on the first positive sampled voltage, the first negative sampled voltage, the second positive sampled voltage, and the second negative sampled voltage.

* * * * *